United States Patent
Schubert et al.

(10) Patent No.: US 8,093,759 B2
(45) Date of Patent: Jan. 10, 2012

(54) REGULATED ENERGY SUPPLY FOR A RAPIDLY CYCLING INTEGRATED CIRCUIT WITH REDUCED ELECTROMAGNETIC RADIATION

(75) Inventors: Goeran Schubert, Schwabach (DE); Thomas Steinecke, Woerth (DE); Uwe Keller, Altenbeken (DE); Thomas Mager, Salzkotten (DE)

(73) Assignees: Conti Temic microelectronic GmbH, Nuernberg (DE); Fraunhofer-Gesellschaft zur Foerderung der Angewandten Forschung e. V., Munich (DE); Infineon Technologies AG, Neubiberg (DE)

( * ) Notice: Subject to any disclaimer, the term of this patent is extended or adjusted under 35 U.S.C. 154(b) by 104 days.

(21) Appl. No.: 12/310,854

(22) PCT Filed: Aug. 30, 2007

(86) PCT No.: PCT/DE2007/001547
§ 371 (c)(1), (2), (4) Date: Mar. 9, 2009

(87) PCT Pub. No.: WO2008/028460
PCT Pub. Date: Mar. 13, 2008

(65) Prior Publication Data
US 2009/0322415 A1    Dec. 31, 2009

(30) Foreign Application Priority Data
Sep. 8, 2006  (DE) .......................... 10 2006 042 800

(51) Int. Cl.
*H02J 1/02* (2006.01)
*H02M 1/12* (2006.01)
*H02M 1/14* (2006.01)

(52) U.S. Cl. .......... 307/105; 307/18; 713/300; 713/310; 713/320; 713/321; 713/322; 713/323; 713/324; 713/330; 713/340; 363/137; 327/564

(58) Field of Classification Search ........................ None
See application file for complete search history.

(56) References Cited

U.S. PATENT DOCUMENTS
4,551,668 A    11/1985 Kammiller
(Continued)

FOREIGN PATENT DOCUMENTS
DE    197 46 113    4/1998
(Continued)

OTHER PUBLICATIONS
PCT, International Preliminary Report on Patentability for Application No. PCT/DE2007/001547, dated Apr. 22, 2009, 6 pages, International Bureau of WIPO, Geneva, Switzerland.

*Primary Examiner* — Rexford Barnie
*Assistant Examiner* — Justen Fauth
(74) *Attorney, Agent, or Firm* — W. F. Fasse; W. G. Fasse (57) ABSTRACT

A device (12) supplies energy to a rapid cycling and/or rapidly cycled integrated circuit (13, 52) which includes a circuit load (17) and an internal capacity (15) connected parallel to the circuit load (17). The integrated circuit (13, 52) has a high cycle frequency (f1) especially at least in the MHz range. A supply unit (14) especially designed as a current source is directly connected to the internal capacity (15). The supply unit (14) has an internal resistance, the impedance level of which is so high at the cycle frequency (f1) that a current ($I_{D2}$) supplying the circuit load (17) originates to a greater degree from the internal capacity (15) than from the supply unit (14). At least one auxiliary load, current sink or load controller is provided as an integral component of the integrated circuit and is connected to the circuit load to smooth load fluctuations.

22 Claims, 7 Drawing Sheets

U.S. PATENT DOCUMENTS

| | | | |
|---|---|---|---|
| 5,616,952 A | 4/1997 | Nakano et al. | |
| 5,874,827 A | 2/1999 | Hashimoto | |
| 6,252,384 B1 | 6/2001 | Arai et al. | |
| 6,580,597 B2 * | 6/2003 | Kanouda et al. | 361/502 |
| 6,963,110 B2 * | 11/2005 | Woo et al. | 257/355 |
| 7,061,142 B1 * | 6/2006 | Marshall | 307/106 |
| 2004/0217442 A1 * | 11/2004 | Miyagi | 257/531 |
| 2005/0030092 A1 * | 2/2005 | Greitschus et al. | 327/552 |
| 2006/0148306 A1 * | 7/2006 | Desinger et al. | 439/482 |
| 2007/0109699 A1 * | 5/2007 | Ito et al. | 361/56 |
| 2008/0197820 A1 | 8/2008 | Schubert | |

FOREIGN PATENT DOCUMENTS

| | | |
|---|---|---|
| WO | WO 03/012870 | 2/2003 |
| WO | WO 2006/094469 | 9/2006 |

* cited by examiner

REGULATED ENERGY SUPPLY FOR A RAPIDLY CYCLING INTEGRATED CIRCUIT WITH REDUCED ELECTROMAGNETIC RADIATION

FIELD OF THE INVENTION

The invention relates to a device for supplying energy to a rapid cycling and/or rapidly cycled integrated circuit while reducing the radiation of electromagnetic energy.

BACKGROUND INFORMATION

Currently, as in other fields of technology, integrated circuits are increasingly also being used in automobile technology, for example in the form of microprocessors or microcontrollers. Devices for supplying energy are provided in order to operate them. Known devices of this type generally contain an external blocking capacity (i.e. capacitance or capacitor) which is parallel connected between a supply inlet of the integrated circuit and earth (i.e. ground), and a voltage source which is connected parallel to it. The voltage source charges the blocking capacity, and the energy which is supplied to the integrated circuit is extracted from the blocking capacity by means of a discharge current. The intention is to hereby achieve the most realistic replica possible of an ideal voltage source. However, the known energy supply devices lead to an unwanted high level of radiation of electromagnetic energy, in particular when a cycle frequency of the integrated circuit reaches levels which are greater than 10 MHz. Then, when applicable, the EMC automobile industry standards are also no longer met.

PCT/DE2005/000433 published as WO 2006/094469 and US 2008/197820 describes a device of the type described in the above introduction, with the aid of which an integrated circuit can also be supplied with energy when it has a high cycle rate, in particular in the MHz range, wherein at the same time, the EMC automobile industry standards are also met.

On the one hand, no external circuit is required with the additional blocking capacity. Instead, an internal bus capacity which is already present within the integrated circuit is used. On the other hand, instead of the low-ohmic voltage source used with the known devices, an energy supply with the highest possible internal resistance is used.

The combination of both measures causes a frequency decoupling of the charging and discharging of the bus capacity. While the bus capacity continues to be discharged with the high cycle frequency, by contrast, the charging is achieved with a significantly lower frequency. The latter occurs as a result of the low-pass behavior of the combination of the bus capacity and high-ohmic internal resistance of the supply unit. Regarding the charging, the charging frequencies which occur are at least one order of magnitude smaller than the discharging frequencies which occur in connection with the discharging, which are mainly determined by the fundamental wave (=cycle frequency) of the cycle rate of the integrated circuit and its harmonic waves. Incidental interruptions are created by the internal communication, the fundamental frequency of which is usually operated at half the cycle rate. Signal components with the high-frequency discharging currents are narrowly restricted spatially and are essentially only present within the integrated circuit. Signal components with the low-frequency charging currents also run through a printed circuit board, however, onto which the integrated circuit is mounted. Neither of the signal components creates any significant radiation of electromagnetic energy—the discharge signal component due to the narrow spatial restriction within the integrated circuit, and the charge signal component due to the low frequency.

SUMMARY OF THE INVENTION

The object of the invention is to realize a device of the type described in the above introduction.

In order to attain this object, an embodiment of a device for supplying energy to a rapid cycling, integrated circuit is provided in accordance with the features described herein. In an embodiment of such a device according to the invention, at least one auxiliary load which is arranged parallel to the circuit load and which can be connected and disconnected, or a current sink, is provided which offsets the high-frequency load fluctuations of the circuit load, wherein the auxiliary load or current sink respectively, is particularly an integral component of the circuit. This results in particular in an adaptation of the load change speed to the regulation speed of the regulating unit which comprises the supply unit.

Overall, therefore, an integrated circuit with a high cycle rate can be supplied with electric energy by means of a device according to the invention, without any significant radiation of electromagnetic energy occurring as a result. The EMC automobile industry standards are still met, even with cycle frequencies in the upper MHz range.

One embodiment fundamentally ensures the current source character of the energy supply device for higher frequencies, by providing the internal resistance with at least one inductance.

In another embodiment, means are provided for an incremental load change, to effect an adaptation of the load change speed to the regulation speed of the regulation unit which comprises the supply unit.

By contrast, other inventive features effect a temporary adaptation of the regulation speed of the regulation unit which comprises the supply unit to the load change speed. Namely, according to one embodiment, the supply unit contains an auxiliary source which can be connected and disconnected. According to another embodiment, means are provided for the temporary reduction of an effective internal resistance level of the supply unit.

In order to achieve a reduction in the effects created by load fluctuations on the voltage on the internal capacitance, another feature of the invention provides another capacitance connected parallel to the internal capacitance.

Another variant wherein a parallel capacitor is connected via separated bond wires reduces the high frequency voltages which occur on the supply pins of the integrated circuit. If the capacitor which is connected parallel to the internal capacitance cannot be mounted on the integrated circuit, it can also be positioned on the printed circuit board. As a result, the separate bond wires must be led to separate pins, to which the aforementioned capacitor is connected.

In another inventive embodiment, a ferrite element is connected between the ground of the integrated circuit and the ground of the printed circuit board. This reduces high frequency currents in the ground of the printed circuit board.

The current source may comprise a series connection of a voltage source and the internal resistance, which can be realized in a simple manner. Namely, a current source which is ideally characterized by an infinitely high internal resistance, is replicated by means of a series connection of a low-ohmic voltage source with the internal resistance which is dimensioned according to the application. A voltage source can be structured in a simple manner. This also applies in particular to a voltage-controlled voltage source.

A further embodiment provides a regulation unit for regulating the energy supplied to the integrated circuit by the supply unit. This feature ensures that the energy feed corresponds to the current requirement.

The regulation unit further preferably comprises a low pass connected to the internal capacitance for recording a voltage which drops across the circuit load. This also guarantees that the regulation unit has an advantageously low regulation speed. Abrupt changes to the voltage across the internal capacity only lead to a slow subsequent feed of charge energy due to the low-pass effect.

Preferably the supply provided by the supply unit has a low pass behavior with a transition frequency lower than the cycle frequency. This prevents high frequency signal components from also occurring to any significant degree outside of the integrated circuit, i.e. for example on the incoming and outgoing feed lines on the printed circuit board, and leading to radiation there.

In further preferred embodiments, the internal resistance comprises at least one ferrite element or the internal resistance comprises at least one low-capacity resistive element and particularly a ferrite element that is connected in series. This prevents a too strong influence of parallel capacitances of the individual elements used to realize the internal resistance. Parallel capacitances are disadvantageous since they comprise a low impedance level with high frequencies. The series connection of a resistance and a ferrite element reduces the unwanted influence of the parallel capacitance of the ferrite element.

The influence of the parasitic parallel capacitance of the resistance is also reduced if several resistances are connected in series. A good compromise between cost and benefit is provided in particular by the series connection of four low-capacity resistances. The at least one low-capacity resistance reduces the bridging capacity of the overall arrangement and provides an effective fundamental damping, in contrast to which the ferrite element has an advantageous high loss share, specifically in the range of the high cycle frequency.

The advantageous further embodiments described below can be present in any combination required.

BRIEF DESCRIPTION OF THE DRAWINGS

Further features, advantages and details of the invention are included in the following description of exemplary embodiments, with reference to the drawings, in which.

DETAILED DESCRIPTION OF EXAMPLE EMBODIMENTS OF THE INVENTION

Parts which correspond to each other are assigned the same reference numerals in FIGS. 1 to 12.

Figure 1:
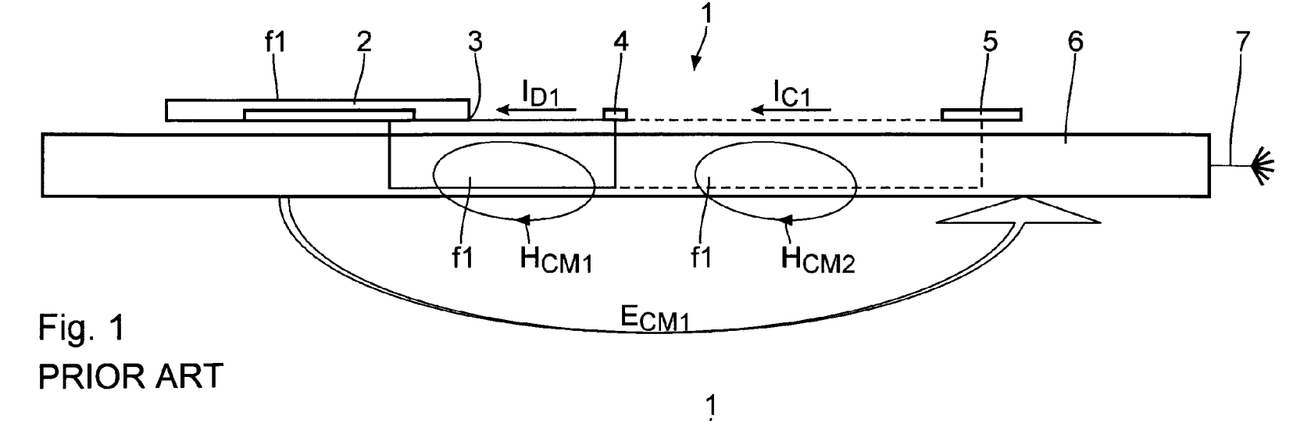
FIGS. 1 and 2 show a device for supplying energy to a circuit according to the prior art
Figure 2:
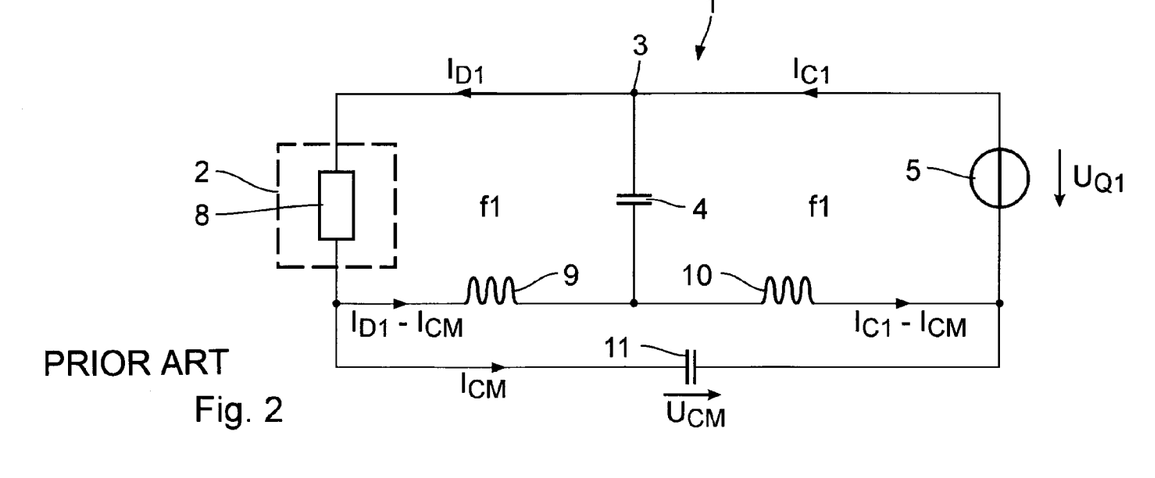

In FIGS. 1 and 2, a device 1 for supplying energy to an integrated circuit 2 according to the prior art is shown. A supply input 3 of the integrated circuit 2 is connected parallel to an external blocking capacity 4 and a supply unit 5 which is designed as a voltage source. The integrated circuit 2, the blocking capacity 4 and the supply unit 5 are arranged on a dual-layer printed circuit board 6, to which a cable harness 7 is connected. In the equivalent circuit diagram according to FIG. 2, the integrated circuit 2, which is for example designed as a rapid cycling microprocessor or microcontroller, or also as a rapid cycling memory element, is reproduced as a complex impedance 8. Also, in the earth or ground return line, two common mode inductances 9 and 10 are arranged, to which an antenna roof capacity 11 is connected in parallel.

The known device 1 for supplying energy has the following mode of functioning. The supply unit 5 delivers a source voltage U.

By means of the parallel connected blocking capacity 4, which has for example a capacity level of approximately 100 nF, an ideal voltage source is replicated. The energy supply unit 5 delivers a charge current $I_{C1}$, by means of which the blocking capacity 4 is charged. A discharge current $I_{D1}$ which is removed from the blocking capacity 4 supplies the integrated circuit 2 with energy. The charge current circuit is shown in FIG. 1 with broken lines and the discharge circuit is shown with unbroken lines. With each switching process of the integrated circuit 2, thus part of the charge of the blocking capacity 4 is removed from it. The potential difference which occurs as a result is offset by immediate recharging by means of the energy supply unit 5.

The charge current $I_{C1}$ and the discharge current $I_{D1}$ contain the same frequency components, which are essentially determined by the rapidly cycled, integrated circuit 2, in particular by its cycle frequency f1. As a result, the magnetic fields $H_{CM1}$ and $H_{CM2}$ occur, which as concentrated elements correspond to the common mode inductances 9 and 10 (FIG. 2) in the incoming and outgoing feeds of the charging and discharging circuit, and cause reductions in voltage levels with an equally high cycling frequency f1. Within the incoming and outgoing feeds of the printed circuit board 6, a common mode voltage $U_{CM}$ is thus developed, which is linked to an electric field $E_{CM1}$ (FIG. 1), and which due to the energy storage property of the inductances 9 and 10 (FIG. 2) drives a common mode current $I_{CM}$.

As part of the invention, it has been recognized that the overall arrangement consisting of the printed circuit board 6 and the cable harness 7 has a di-polar type antenna behavior. The common mode current $I_{CM}$ is therefore radiated at least to a certain extent. The degree of radiation here depends strongly on the cycling frequency f1. Due to the di-polar behavior, the radiation increases with the square of the cycling frequency f1.

A high cycling frequency f1, which lies for example in the n×10 MHz range, thus leads to a very high degree of radiation. The radiated energy here originates to the greatest extent from the displacement current of the antenna roof capacity 11 (FIG. 2), i.e. from the common mode current $I_{CM}$.

The described radiation behavior of the known device 1 results in the fact that the EMC standards which are specified in particular for utilization of the device 1 in automobile technology can no longer be met with increasing cycle frequencies f1.

The exemplary embodiments shown in FIGS. 3 to 12 of devices according to the invention for supplying energy avoid the described disadvantages of the known device 1. They have strongly reduced radiation behavior, so that the EMC standards set by the automobile industry are also met with a high cycle frequency f1.

Figure 3:
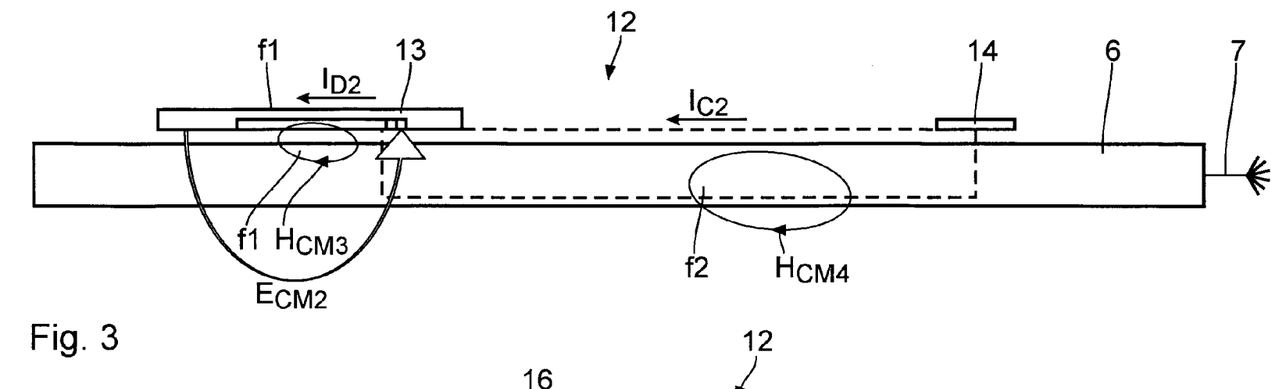
FIGS. 3 and 4 show an exemplary embodiment of a device according to the invention for supplying energy to a circuit
Figure 4:
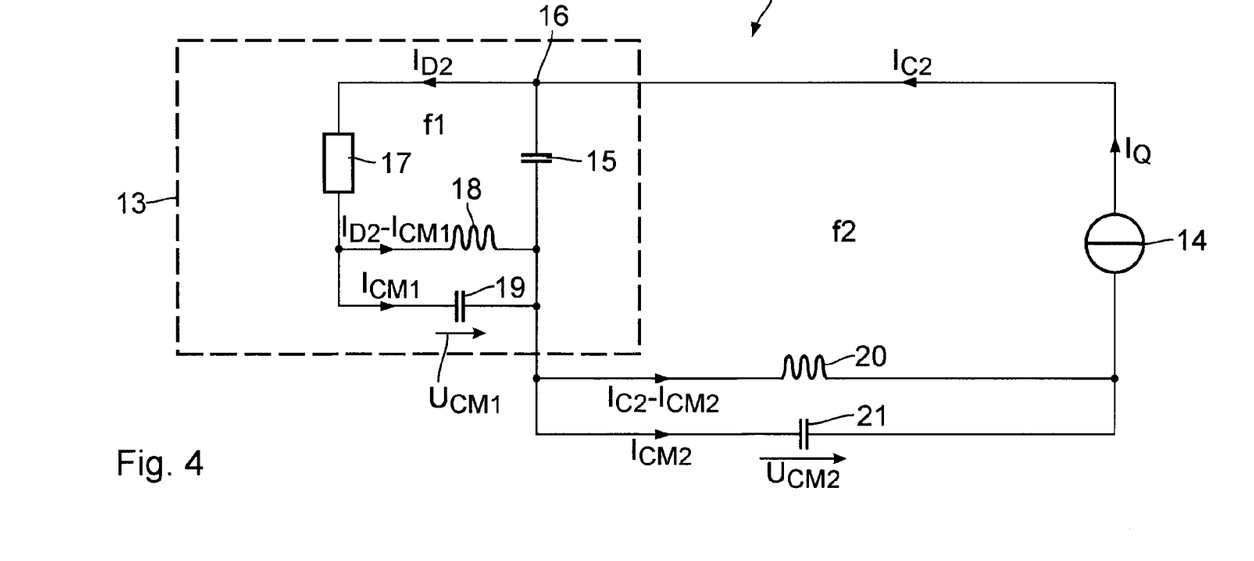

In FIGS. 3 and 4, a first exemplary embodiment of a device 12 for supplying energy to an integrated circuit 13 by means of a supply unit 14 is shown. In contrast to the device 1, the device 12 does not contain a separate external blocking capacity 4. Instead, use is made of an internal bus capacity 15, which is arranged as a component of a supply bus to the integrated circuit 13 parallel to a supply inlet 16, and which has for example a capacity level of approximately 5 nF. Due to the recourse to the bus capacity 15, which is already present, the cost of realization is reduced. Also, the supply unit 14 is not designed as a low-ohmic voltage source as with the device 1, but as a high-ohmic voltage source.

According to FIG. 4, the integrated circuit 13 contains, alongside the bus capacity 15 and a circuit load 17 which is actually to be supplied with power, and which is symbolized as an impedance, in its earth or ground return line, a common mode inductance 18 and an antenna roof capacity 19 which is arranged parallel to it. Accordingly, the charge current circuit, which runs essentially over the printed circuit board 6, also comprises in its earth return line a parallel connection consisting of a common mode inductance 20 and an antenna roof capacity 21.

The mode of functioning of the device 12 according to the invention will now be described in greater detail below. The charge current circuit and the discharge current circuit are decoupled, both in spatial terms and in terms of frequency. The discharge current circuit is restricted to the area of the integrated circuit 13, in contrast to which the charge current circuit essentially runs in the printed circuit board 6. A discharge current $I_{D2}$, by means of which energy is removed from the bus capacity 15 and fed to the circuit load 17, comprises frequency components which are essentially determined by the high cycle frequency f1. In contrast, the charging of the bus capacity 15 is achieved by means of a charge current $I_{C2}$, which has a significantly lower charge frequency f2 and which is provided as a source current $I_Q$ by the supply unit 14.

The bus capacity 15 and the high-ohmic internal resistance of the supply unit 14 form a low pass which determines the essentially lower frequency f2 of the charge current $I_{C2}$. In the ideal scenario of an infinitely high internal resistance, the charge current $I_{C2}$ contains one constant or DC component alone. However, even in a practical realization, the charge frequency f2 is also at least one order of magnitude lower than the cycle frequency f1. Typically, the charge frequency f2 varies within the kHz range, and the cycle frequency f1 varies between 50 MHz and 300 MHz. With a charge frequency f2 which is so low, a magnetic field $H_{CM4}$, which is linked to the charge current $I_{C2}$ leads to a lower common mode voltage $U_{CM2}$ which is proportionate to the frequency reduction. The efficiency of the di-polar structure of the overall arrangement even declines by the square of the frequency reduction of f1 to f2, so that only a very low common mode current $I_{CM2}$ is developed within the printed circuit board 6, and no significant radiation occurs. For this reason, the common mode inductance 20 and the antenna roof capacity 21 are in each case omitted from the drawings of FIG. 6 and FIGS. 8 to 12 below.

Within the integrated circuit 13, a magnetic field $H_{CM3}$ which accompanies the discharge current $I_{D2}$ leads to the formation of an electric field $E_{CM2}$ and a common mode voltage $U_{CM1}$ due to the higher frequency components. Accordingly, a common mode current $I_{CM1}$ is also formed in the earth return line. Since the area of the integrated circuit 13 encompassed by the current $I_{D2}$ is significantly smaller than the area of the printed circuit board 6 which is encompassed by $I_{D1}$ in the device 1, a significantly reduced radiation results. Assuming that an ideal supply unit is provided, a comparative estimate of the areas of the devices 1 and 12 that are respectively covered, i.e. of the areas which are encompassed by the high frequency currents $I_{C1}$ and $I_{D1}$ or $I_{D2}$, produces a reduction in radiation by a factor of approximately 10,000.

Figure 5:
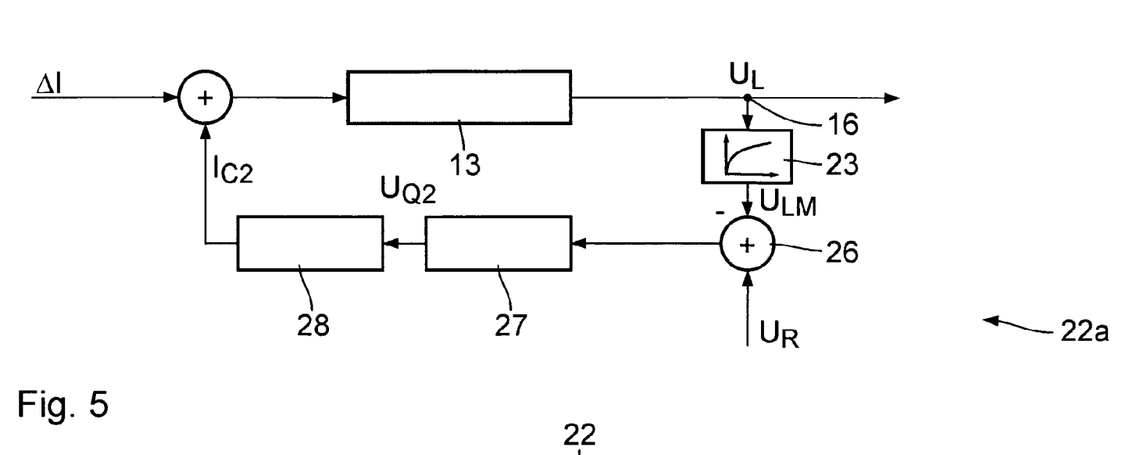
FIG. 5 shows a block diagram for the regulation of energy supply according to FIGS. 3 and 4

FIG. 5 shows a block diagram for a regulation of the energy supply of the device 13. A realization of this regulation concept is given in a further exemplary embodiment of a device 22 shown in FIG. 6 for the supply of energy to the integrated circuit 13. The regulation ensures that the circuit load 17 is provided with a constant load voltage $U_L$ for the supply of energy. Since it is essentially only of significance that the average level of the voltage which drops across the bus capacity 15 is kept constant, the load voltage $U_L$ can be directly tapped on the supply inlet 16, wherein both the common mode inductance 18 and, if appropriate, additional bond inductances which are present can be disregarded.

A regulation unit 22a comprises a low pass 23 which is connected to the supply inlet 16, which is created by means of a low pass resistance 24 and a low pass capacity 25, a reference junction 26, a regulator 27 and a U/I converter 28. With the exemplary embodiment shown in FIG. 6, the reference junction 26 and the regulator 27 are integrated into a voltage-controlled voltage source 29. The U/I converter 28 is realized as a high-ohmic internal resistance 30 in particular in the range of the cycle frequency f1. The series connection of the voltage source 29 and the high-ohmic internal resistance 30 forms the supply unit 14 which is designed as an element of the regulation unit 22a. This series connection is a replication of a current source.

Figure 6:
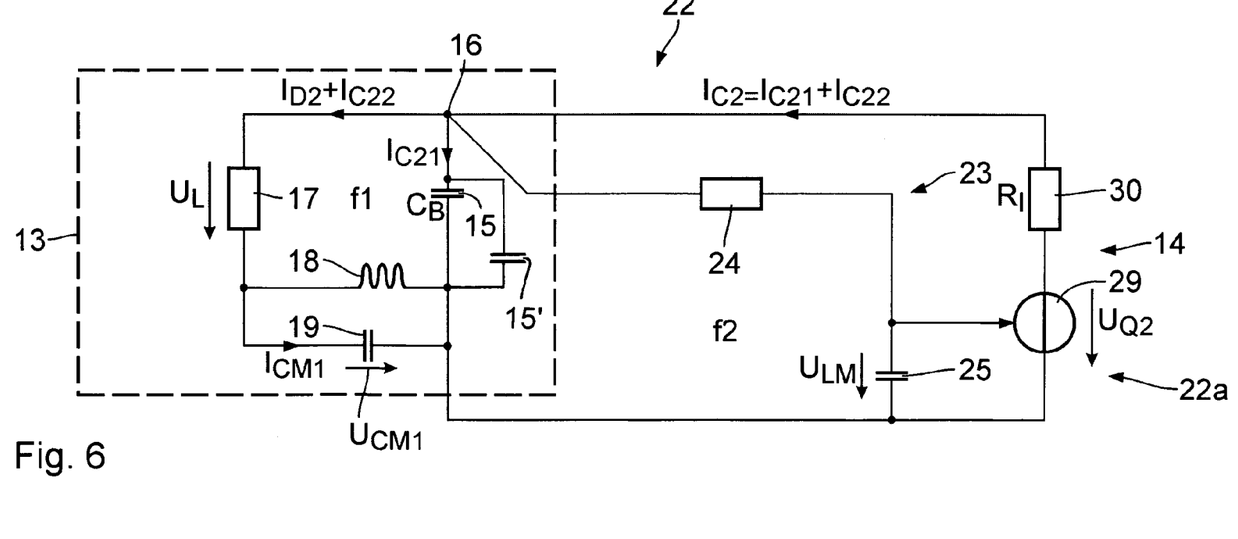
FIG. 6 shows an exemplary embodiment of a device according to the invention for the regulated energy supply of a circuit

With reference to FIGS. 5 and 6, the mode of functioning will now be described of the regulated energy supply used with the device 22. The load voltage $U_L$ which is also present as a first approximation on the supply inlet 16 is detected on the low pass capacity 25 as a measured load voltage $U_{LM}$, and is fed to the reference junction 26 which is integrated into the voltage source 29. Depending on the deviation from a specified reference voltage $U_R$, the regulator 27 is triggered so that on its outlet, and therefore also on the outlet of the voltage source 29, a source voltage $U_{Q2}$ is present. The latter is converted by means of the high-ohmic internal resistance 30 into the charge current $I_{C2}$, which is fed to the integrated circuit 13 in order to supply energy. Deviations which arise as a result of load fluctuations or other random events are taken into account in the block diagram according to FIG. 5 by loading the charge current $I_{C2}$ with a disturbance variable $\Delta_I$.

Due to a corresponding dimensioning of the low pass 23, the regulation speed is restricted so that the transit frequency of the regulation is smaller than the fundamental wave (=cycle frequency f1) of the cycling of the circuit 13. In particular, this transit frequency lies below the cycle frequency f1 by at least one order of magnitude. With a cycle frequency f1 of 50 MHz, for example, the highest frequency which the regulation then typically causes or allows to be created, is less than or equal to 1 MHz. This ensures that practically no high frequency signal components which are of relevance to radiation occur in the printed circuit board 6.

In precise terms, the latter statement applies solely to an infinite internal resistance 30. In practice, the internal resistance 30 has a finite value, however, so that the charge current $I_{C2}$ is compiled of a first low frequency charge current component $I_{C21}$ and a second high frequency charge current component $I_{C22}$. The first charge current component $I_{C21}$ is used for charging the bus capacity 15, and the second charge current component $I_{C22}$ is fed together with the discharge current $I_{D2}$, which is also high frequency, to the circuit load 17 for the purpose of supplying energy. Here, the charge current $I_{D2}$ which is removed from the internal bus capacity 15 is significantly greater than the high frequency second charge current component $I_{C22}$ which is removed from the charge current circuit. A corresponding damping a(f) results in:

$$a(f) = \left|\frac{I_{C22}}{I_{D2}}\right| = \left|\frac{1}{j2\pi f R_I C_B}\right|,$$

wherein $R_I$ represents the value of the internal resistance 30, $C_B$ represents the value of the bus capacity 15 and f represents the frequency. Here, it is a requirement that the internal resistance 30 can be shown in an idealized manner as a purely ohmic resistance. When examined more precisely, however, the parasitic parallel capacity should also be taken into account.

The parallel capacity is not wanted, since it represents a low ohmic bridge of the ohmic component of the internal resistance 30, in particular with high frequencies. In order to minimize this influence, the internal resistance 30 is preferably realized by means of the series connection of several resistances.

Figure 7:
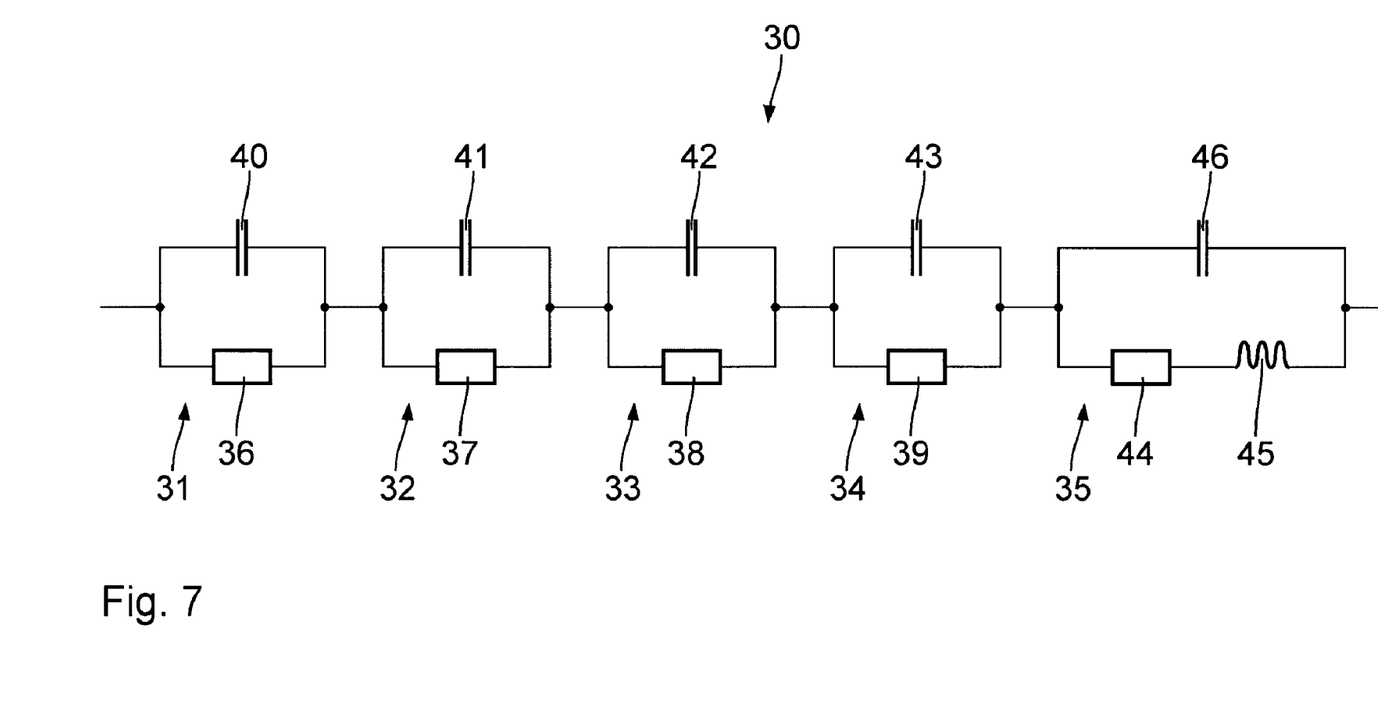
FIG. 7 shows an exemplary embodiment of an internal resistance of the energy supply according to FIG. 6, and FIGS. 8 to 12 show further exemplary embodiments of devices according to the invention for the regulated energy supply of a circuit.

FIG. 7 shows a corresponding exemplary embodiment of the internal resistance 30. It contains a series connection of four low capacity partial resistances 31, 32, 33, 34 in total, and one ferrite element 35. The partial resistances 31 to 34 each have an ohmic resistance 36, 37, 38 and 39 and a parallel capacity 40, 41, 42 and 43. The higher the number of partial resistances 31 to 34 which are connected in series, the lower the unwanted influence of the parasitic parallel capacities 40 to 43 which for example have a value of less than 0.5 pF. With a total of four partial resistances 31 to 34 which are connected in series, a good compromise is achieved between cost and benefit.

The ferrite element 35 which is also contained in the series connection of the internal resistance 30 comprises a series connection of a ferrite resistance 44 and a ferrite inductance 45 and a ferrite capacity 46 which is arranged in parallel to the stated series connection. The partial resistances 31 to 34 which are connected in series to the ferrite element 35 also reduce the influence of the parallel ferrite capacity 46.

While the continuous current resistance of the ferrite element 35 is practically zero ohm, the ohmic component of the ferrite inductivity 45 in particular causes a desired high loss resistance in the kΩ range with high frequencies, i.e. above all with the carrier frequency f1 and its harmonic waves, and removes high frequency energy from the electric circuit by converting it into thermal energy. The ohmic resistances 36 to 39 have a total value of up to approximately 1000Ω. They reduce the bridging capacity of the overall arrangements and provide an effective fundamental damping. The internal resistance 30 according to FIG. 7 therefore has a frequency dependent overall impedance value which increases, in particular when the frequency rises.

The partial resistances 31 to 34 reduce the bridging ferrite capacity 46 to approximately a ¹/₂₄th share of its original value. In addition, they increase the resonance frequency of the overall arrangement including the device 22, the printed circuit board 6 and the cable harness 7 to approximately 6 times the frequency.

With the dimensioning of the internal resistance 30, a consideration is made between the greatest possible ohmic resistance value $R_I$ and the value of the source voltage $U_{Q2}$ which can still be provided at a reasonable cost. With the increasing resistance $R_I$, a higher source voltage $U_{Q2}$ is namely also required, in order to obtain the charge current $I_{C2}$ with the necessary current strength which can typically lie in the n×100 mA range. The regulator 27 which is constructed for example as an upwards/downwards switch regulator is designed for a measured load voltage $U_{LM}$ and for a source voltage $U_{Q2}$, the values of which move in the range of between several volts and several tens of volts. The internal resistance 30 is however always dimensioned in such a manner that its impedance value is so high with the cycle frequency f1 that a high frequency current which supplies the circuit load 17 originates to a greater extent from the bus capacity 15 than from the supply unit 14.

The effect of load fluctuations on the voltage on the internal capacity 15 is clearly reduced when the capacity value is significantly increased. A considerable increase then occurs when e.g. the internal capacity of the voltage supply 14, which is usually low, is increased to 100 nF by drivers for external processor buses or external memory elements which lie e.g. in a range of 300 pF-3 nF. Thus, on the one hand, more charges can be removed per time unit from the capacity or pushed into the capacity without the voltage declining or increasing to unpermitted levels, while on the other hand, the quality of the resonance circuit decreases, which is predominantly formed from the internal capacity 15 and the external feed line inductance the main component of which is formed by the inductance of the ferrite 45. Thus, the qualities can be effectively reduced to values of approximately 1, alongside the related resonance enhancements. The capacitor 15' in FIG. 6 with the additional capacity must here be connected via separate bond wires directly parallel to the on chip capacity 15. In particular, the supply current which flows through the circuit supply pins may not flow via the connection wires of the additional capacity 15'. The additional capacity 15' can be designed as an additional ceramic capacitor and is preferably to be connected directly on the substrate carrier in a preferably low inductive manner to the on chip capacity 15.

With regard to the higher precision standards for processors with reduced supply voltage (3.3V ... 1.5V) and the reduced effect of load fluctuations on the voltage constancy which is required as a result, the described capacity increase from ceramic capacitors 15' described can be generally recommended.

Figure 12:
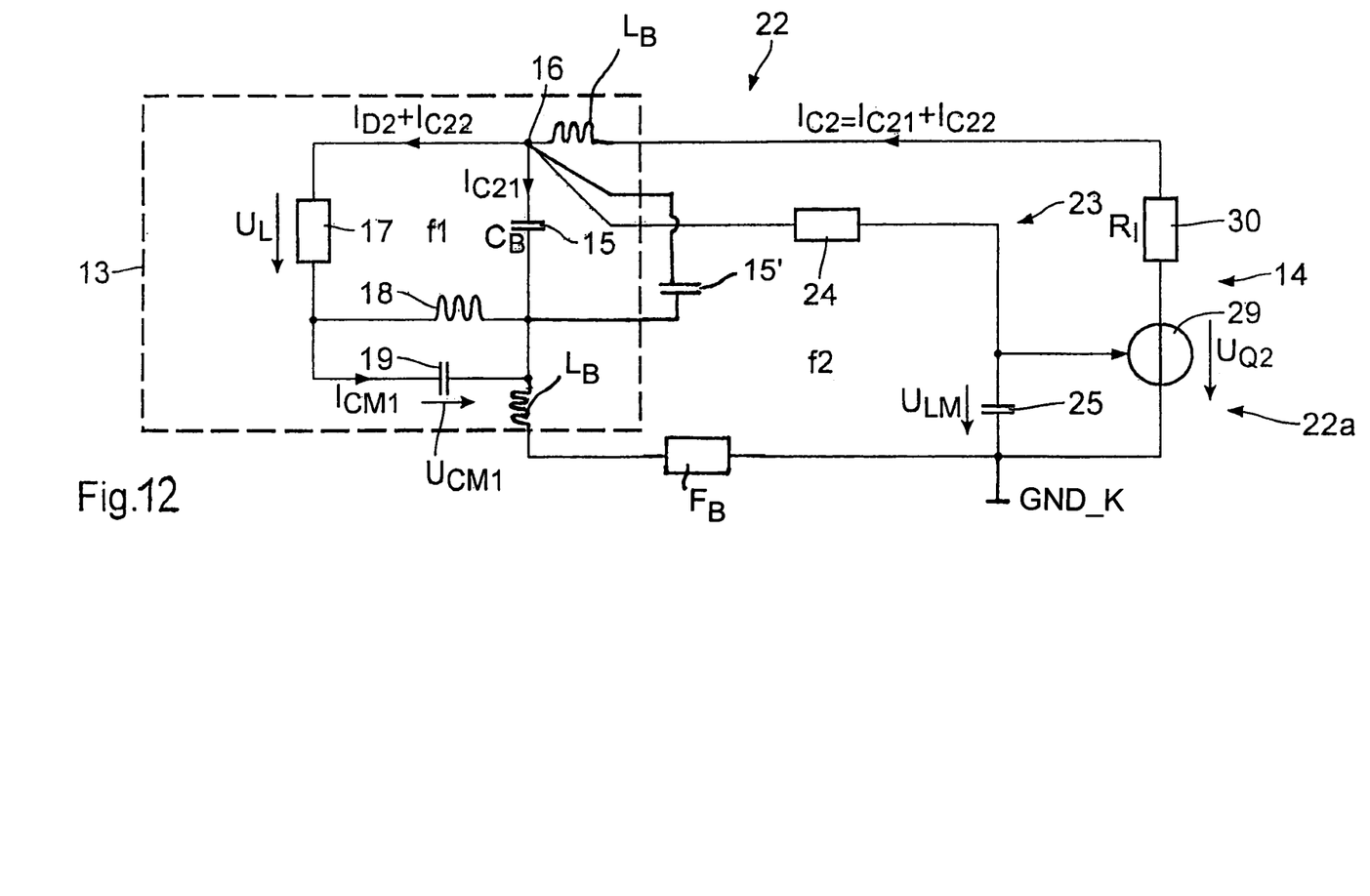

If the ceramic capacitor 15 cannot be housed i.e. mounted directly on the integrated circuit 13, it can also be housed outside the integrated circuit 13 on the printed circuit board, as shown in FIG. 12. Here, it is important that the capacitor 15' is connected via separate pins. The voltage supply and ground bond inductance ($L_B$) ensures a high frequency decoupling to the voltage supply 14 and above all, to the ground of the printed circuit board. The decoupling to the ground of the printed circuit board can be increased by inserting a ferrite ($F_B$) between the ground of the integrated circuit 13 and the ground (GND_K) of the printed circuit board.

FIGS. 8 to 11 show further exemplary embodiments of devices 47, 48, 49 and 50 for supplying energy to an integrated circuit 51, 52 and the integrated circuit 13. The devices 47 to 50 contain adaptation means which are provided for cases when load fluctuations occur in the integrated circuits 51, 52 and 13 and the circuit load 17 adopts time variable values. This occurs, for example, when the affected integrated circuit 13, 51 or 52 goes into an idle mode. The regulation unit 22a has the lowest regulation speed possible in order to guarantee a lower radiation of energy. For this reason, an abrupt load fluctuation in particular cannot be offset rapidly, but only with the low regulation speed of the regulation unit 22a. This can lead to unwanted excess voltages or under voltages on the bus capacity 15. The aforementioned adaptation means are provided in order to avoid this.

Figure 8:
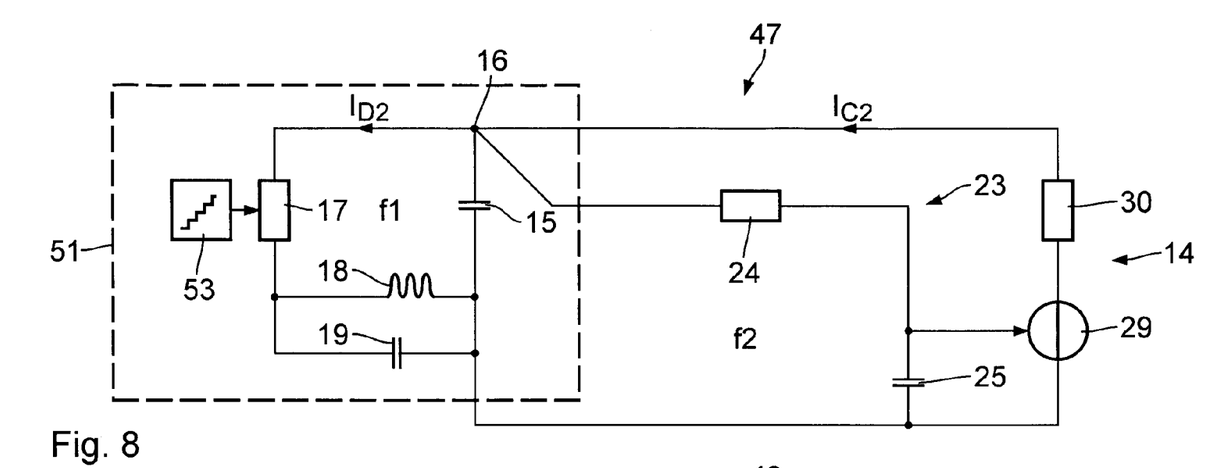
Figure 9:
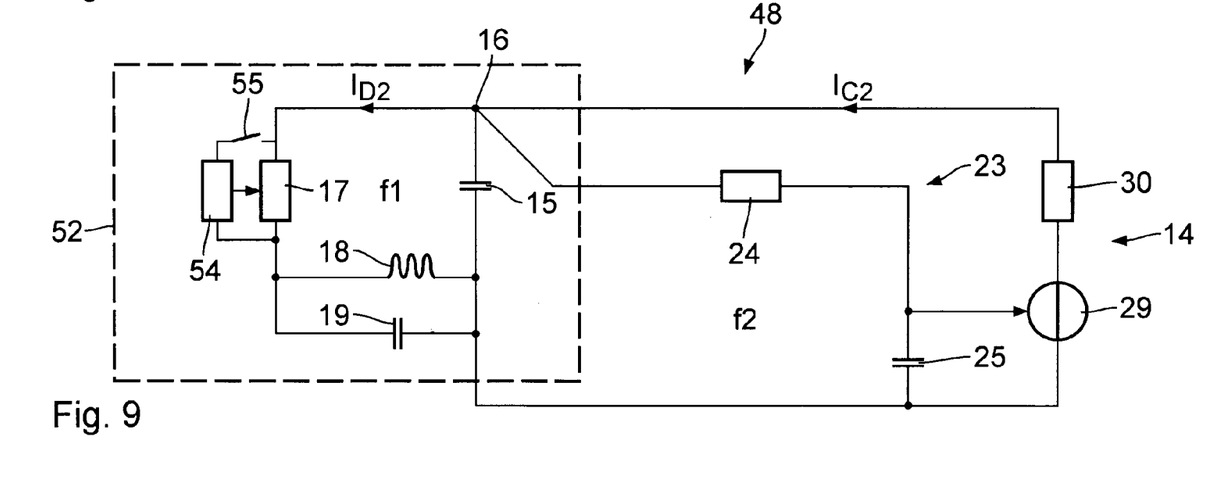

The devices 47 and 48 shown in FIGS. 8 and 9 lead in each case to an adaptation of the load change speed to the regulation speed. For this purpose, the device 47 comprises adaptation means 53, which effectuate a load change of the circuit load 17 only stepwise and especially only so gradually that a readjustment can be made by means of the regulation unit 22a. With the alternative solution according to the device 48, at least one auxiliary load 54 is provided, which lies parallel to the circuit load 17, and which can be connected and disconnected by means of a switch 55. Instead of the auxiliary load 54, a current sink can also be provided which is in particular connected by a regulated operational amplifier to the circuit load 17. The adaptation means 47, the auxiliary load 54 and also the current sink are here integral components of the respective circuit 51 and 52.

Figure 10:
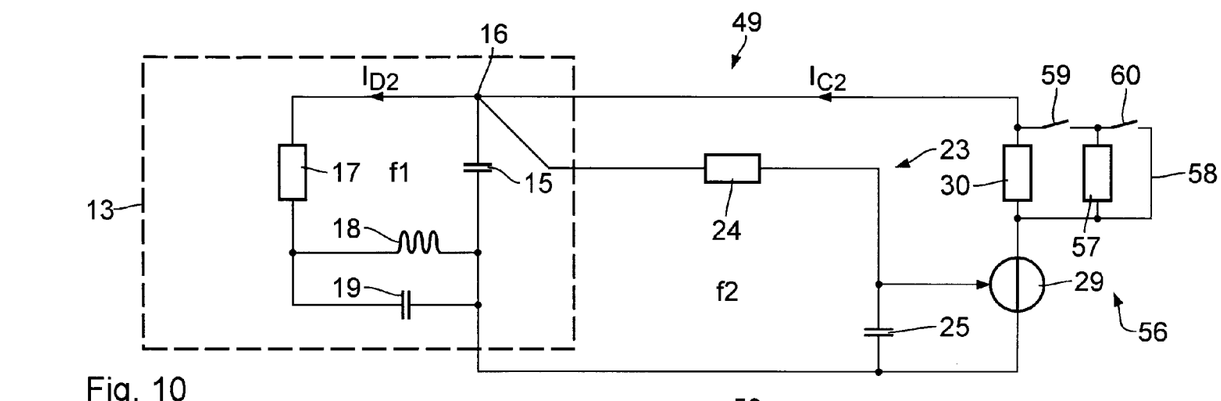
Figure 11:
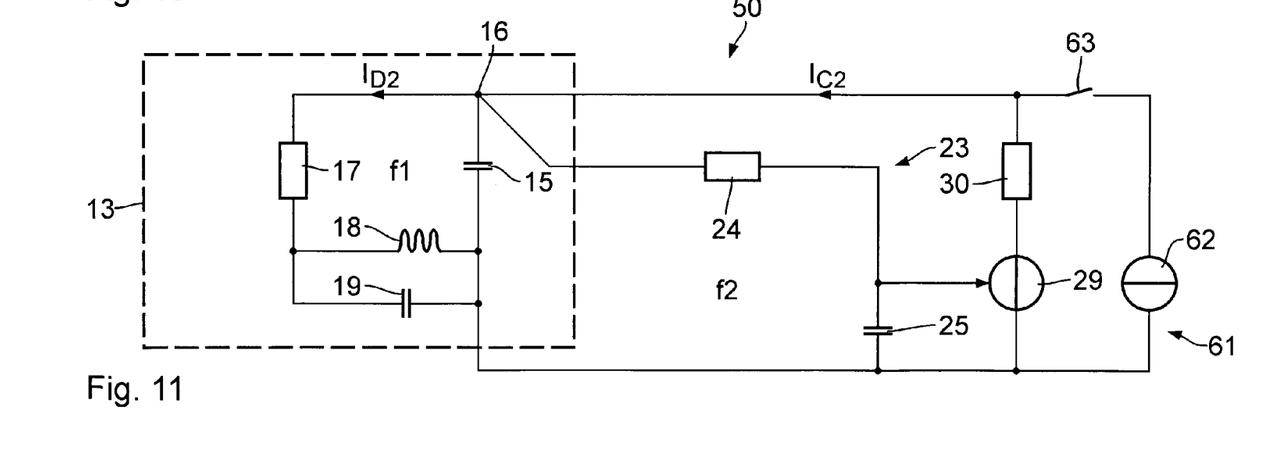

By contrast, the devices 49 and 50 shown in FIGS. 10 and 11 effect a temporary adaptation of the regulation speed to the load change speed. With the device 49, the effective internal resistance of a supply unit 56 can be temporarily reduced. Parallel to the internal resistance 30, at least one further auxiliary internal resistance 57 and/or a short circuit branch 58, which can be connected and disconnected by means of switches 59 and 60, is/are provided. In this manner, the supply unit 56 can be operated at least temporarily as a voltage source with a disappearing internal resistance. The device 50 contains a supply unit 61 with which at least one further auxiliary current source 62 is provided parallel to the voltage source 29 and to the internal resistance 30, and the auxiliary current source 62 can be connected and disconnected by means of a switch 63.

In general, at least parts of the regulating unit 22a and in particular of the supply units 14, 56 or 61 can be incorporated into the respective integrated circuits 13, 51 or 52. This enables easier and rapid communication between the actual integrated circuit 13, 51 or 52 on the one hand and the regulating unit 22a and the supply unit 14, 56 or 61 on the other.

The invention claimed is:

1. An arrangement for supplying power to a rapidly cycling and/or rapidly cycled integrated circuit, which integrated circuit comprises a circuit load and an internal capacity connected parallel to the circuit load in the integrated circuit, wherein:
    a) the integrated circuit has a high cycle frequency, which is at least in the MHz range,
    b) a supply unit comprising a current source is connected to the internal capacity,
    c) the supply unit includes an internal resistance having an impedance value that is so high at the cycle frequency with its harmonics, that a supply current that supplies the circuit load originates to a greater degree from the internal capacity than from the supply unit, and
    d) the arrangement includes a load varying device that is integrated in the integrated circuit and is adapted to smooth load fluctuations, wherein the load varying device comprises one of: an auxiliary load that is selectively electrically connectable in parallel with and electrically disconnectable from the circuit load, a current sink that is connected in a regulated manner to the circuit load, or a load controller that is connected to the circuit load and is adapted to incrementally control load changes of the circuit load at a limited load change rate.

2. The arrangement according to claim 1, wherein the load varying device comprises the auxiliary load that is selectively electrically connectable in parallel with and electrically disconnectable from the circuit load through a switch in the integrated circuit.

3. The arrangement according to claim 1, wherein the load varying device comprises the current sink that is connected to the circuit load by a regulated operational amplifier in the integrated circuit.

4. The arrangement according to claim 1, wherein the load varying device comprises the load controller in the integrated circuit.

5. The arrangement according to claim 1, further comprising a circuit board, wherein the integrated circuit is provided on an integrated circuit chip, the integrated circuit chip is mounted on the circuit board, and the supply unit is arranged separately from the integrated circuit chip on the circuit board.

6. The arrangement according to claim 5, wherein the arrangement does not include an external blocking capacity arranged on the circuit board external to the integrated circuit chip and parallel to the integrated circuit between supply lines connecting the supply unit to the integrated circuit.

7. The arrangement according to claim 5, wherein the arrangement and components thereof are so dimensioned and arranged, so that a discharging current circuit which discharges the internal capacity and supplies a discharge current from the internal capacity as part of the supply current to the circuit load operates at a relatively higher frequency and is limited to the integrated circuit chip, a and so that a charging current circuit which supplies a charging current from the supply unit as part of the supply current to the internal capacity over the circuit board external to the integrated circuit chip operates at a relatively lower frequency compared to the relatively higher frequency of the discharging current circuit.

8. The arrangement according to claim 1, wherein the internal resistance includes an inductance.

9. The arrangement according to claim 1, wherein the internal resistance comprises a ferrite element.

10. The arrangement according to claim 1, wherein the internal resistance includes a plurality of low-capacitance resistive elements and a ferrite element connected in series with one another, each one of the resistive elements respectively includes a capacitance in parallel with a resistance, and the ferrite element includes a resistance and an inductance in series with one another and in parallel with a capacitance.

11. The arrangement according to claim 1, wherein the current source comprises a voltage source connected in series with the internal resistance.

12. The arrangement according to claim 1, wherein the supply unit further comprises an auxiliary current source and a switch that selectively disconnects and connects the auxiliary current source parallel with the current source.

13. The arrangement according to claim 1, further comprising means for temporarily reducing an effective overall internal resistance level of the supply unit.

14. The arrangement according to claim 1, wherein the supply unit further comprises at least one switch, and at least one of a short circuit branch or an auxiliary resistance which is or are selectively disconnected from and connected parallel with the internal resistance by said at least one switch.

15. The arrangement according to claim 1, wherein the supply unit is part of a regulation unit adapted to regulate the power supplied by the supply unit to the integrated circuit.

16. The arrangement according to claim 15, wherein the regulation unit further comprises a low pass, which is connected to the internal capacity to detect a voltage that drops across the circuit load.

17. The arrangement according to claim 1, wherein the supply of the power by the supply unit exhibits a low pass behavior with a transit frequency that is lower than the cycle frequency.

18. The arrangement according to claim 1, further comprising another capacitance connected parallel to the internal capacity.

19. The arrangement according to claim 18, wherein the another capacitance is provided in the integrated circuit.

20. The arrangement according to claim 18, wherein the another capacitance is provided external to and separate from the integrated circuit.

21. The arrangement according to claim 18, wherein the another capacitance is connected parallel to the internal capacity by separated bond wires.

22. The arrangement according to claim 1, wherein the integrated circuit and the supply unit are separately mounted on a circuit board, and the arrangement further comprises a ferrite element connected between a ground of the integrated circuit and a ground of the circuit board.

* * * * *

UNITED STATES PATENT AND TRADEMARK OFFICE
CERTIFICATE OF CORRECTION

PATENT NO.        : 8,093,759 B2
APPLICATION NO.   : 12/310854
DATED             : January 10, 2012
INVENTOR(S)       : Goeran Schubert et al.

It is certified that error appears in the above-identified patent and that said Letters Patent is hereby corrected as shown below:

Column 4,
Line 17, after "voltage", replace "U" by --$U_{Q1}$--;
Line 17 and 18, there should be no paragraph break;

Column 5,
Line 51, after "$H_{CM4}$", delete ",";

Column 6,
Line 4, after "unit", insert --14--;

Column 7,
Line 54, after "approximately", replace "1000Ω" by --100Ω--;

Column 9,
Line 58, after "varying", delete "is";

Column 10,
Line 29, after "chip,", delete "a".

Signed and Sealed this
Sixteenth Day of October, 2012

David J. Kappos
*Director of the United States Patent and Trademark Office*